(12) United States Patent
Sugai et al.

(10) Patent No.: US 10,381,436 B2
(45) Date of Patent: Aug. 13, 2019

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Isamu Sugai, Matsumoto (JP); Takeyoshi Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/983,060

(22) Filed: May 17, 2018

(65) Prior Publication Data

US 2018/0269281 A1  Sep. 20, 2018

Related U.S. Application Data

(63) Continuation of application No. 15/473,636, filed on Mar. 30, 2017, now Pat. No. 10,026,807.

(30) Foreign Application Priority Data

May 16, 2016 (JP) ................................. 2016-097911

(51) Int. Cl.
*H01L 29/06* (2006.01)
*H01L 21/265* (2006.01)
(Continued)

(52) U.S. Cl.
CPC .... *H01L 29/0634* (2013.01); *H01L 21/26513* (2013.01); *H01L 29/0878* (2013.01);
(Continued)

(58) Field of Classification Search
CPC ............. H01L 29/0634; H01L 29/1095; H01L 29/66734; H01L 29/7813; H01L 21/26513
(Continued)

(56) References Cited

U.S. PATENT DOCUMENTS

2001/0048132 A1  12/2001 Ito et al.
2009/0267143 A1*  10/2009 Hsieh .................. H01L 29/0619
                                                  257/331
2013/0049105 A1*  2/2013 Omori ............... H01L 21/26586
                                                  257/330

FOREIGN PATENT DOCUMENTS

JP       H9-266311 A    10/1997
JP       2010-114152 A  5/2010
(Continued)

*Primary Examiner* — Tong-Ho Kim

(57) ABSTRACT

To provide a semiconductor device having a structure capable of forming a superjunction with less thermal history, a semiconductor device is provided, the semiconductor device including a contact trench formed between two gate trenches, penetrating through a source region, and including its lower end arranged in a base region, and a second conductivity-type protruding portion formed protruding toward a lower side from the lower end of the base region in a region opposite to the lower end of the contact trench, wherein the depth from the upper end of the source region to a lower end of the protruding portion is 3 μm or more, and a carrier concentration Nd in a first conductivity-type region adjacent to the protruding portion in a lateral direction perpendicular to a depth direction and a carrier concentration Na of the protruding portion satisfy a predetermined equation.

5 Claims, 11 Drawing Sheets

(51) Int. Cl.
*H01L 29/66* (2006.01)
*H01L 29/78* (2006.01)
*H01L 29/10* (2006.01)
*H01L 29/417* (2006.01)
*H01L 29/08* (2006.01)

(52) U.S. Cl.
CPC .... *H01L 29/1095* (2013.01); *H01L 29/41766* (2013.01); *H01L 29/66727* (2013.01); *H01L 29/66734* (2013.01); *H01L 29/7813* (2013.01)

(58) Field of Classification Search
USPC .......................................................... 257/331
See application file for complete search history.

(56) References Cited

FOREIGN PATENT DOCUMENTS

| JP | 4696335 B2 | 6/2011 |
|----|------------|--------|
| JP | 2013-084899 A | 5/2013 |
| JP | 2013-201361 A | 10/2013 |

\* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation of U.S. patent application Ser. No. 15/473,636, filed on Mar. 30, 2017, which claims priority to Japanese Patent Application NO. 2016-097911 filed on May 16, 2016, the contents of each of which are hereby incorporated herein by reference in their entirety.

BACKGROUND

1. Technical Field

The present invention relates to a semiconductor device and a method of manufacturing a semiconductor device.

2. Related Art

In a semiconductor device of a vertical MOSFET or the like, a trade-off relationship between a breakdown voltage and on-resistance has been known. A superjunction semiconductor element has been known as a technique of achieving low on-resistance while securing a breakdown voltage (refer to, for example, Patent Document 1). The following documents are given as relevant prior art documents.

PRIOR ART DOCUMENTS

Patent Document 1: Japanese Patent Application Publication No. H9-266311
Patent Document 2: Japanese Patent Application Publication No. 2013-84899
Patent Document 3: Japanese Patent No. 4696335
Patent Document 4: Japanese Patent Application Publication No. 2010-114152

In general, in the superjunction semiconductor element, a superjunction structure is formed, and then an MOS structure of a source region or the like is formed. For this reason, impurities of a p-type region and an n-type region in the superjunction structure diffuse due to thermal history at the time of forming the MOS structure, and thus it was difficult to form a good superjunction structure. In the superjunction semiconductor element of fine pitch, this drawback becomes more prominent.

SUMMARY

In a first aspect of the present invention, a semiconductor device is provided. The semiconductor device may include a semiconductor substrate, a first conductivity-type drift region formed on an upper surface side of the semiconductor substrate, a second conductivity-type base region formed over the drift region, and a first conductivity-type source region formed over the base region. The semiconductor device may include two or more gate trenches formed by penetrating through the source region and the base region from an upper end side of the source region. The semiconductor device may further include a contact trench formed between two gate trenches, penetrating through the source region, and including its lower end arranged in the base region. The semiconductor device may include a second conductivity-type protruding portion formed protruding toward a lower side from the lower end of the base region in a region opposite to the lower end of the contact trench. The depth from an upper end of the source region to the lower end of the protruding portion may be 3 μm or more.

A carrier concentration Nd in the first conductivity-type region adjacent to the protruding portion in a lateral direction perpendicular to a depth direction and a carrier concentration Na of the protruding portion may satisfy the following equation.

$$0.9 \leq \frac{Wc - Wt}{Wt} \times \frac{Nd}{Na} \leq 1.1 \qquad \text{[Equation 1]}$$

wherein Wc is an interval between two gate trenches, and Wt is a width of the contact trench.

The depth from the upper end of the source region to the lower end of the protruding portion may be 15 μm or less. The depth from the lower end of the contact trench to the lower end of the protruding portion may be 14.7 μm or less.

The semiconductor device may include a second conductivity-type high concentration region, provided adjacent to the lower end of the contact trench, and having an impurity concentration higher than that of the base region. The width of the protruding portion at the lower end of the base region may be 0.9 times or more and 1.1 times or less the width of the contact trench.

The semiconductor device may include a first conductivity-type region formed adjacent to the lower end of at least one gate trench and the protruding portion, having an impurity concentration higher than that of the drift region. The semiconductor device may include a first conductivity-type intermediate region formed adjacent to the gate trench between the first conductivity-type region and the base region, having an impurity concentration lower than that of the first conductivity-type region. The impurity concentration of the intermediate region may be equal to the impurity concentration of the drift region. The lower end of the protruding portion and the lower end of the first conductivity-type region may be arranged in the same depth position.

The semiconductor device may include a gate insulating film formed on an inner wall of the gate trench and a gate conductive section surrounded by the gate insulating film inside the gate trench. In the gate insulating film, a portion formed at the lower end of the gate trench may be thicker than a portion formed at a side wall of the gate trench.

The lower end of the protruding portion may be arranged in a deeper position than the lower end of the gate trench when viewed from the upper end of the source region. The distance between each gate trench and the protruding portion may be 0.4 μm or more.

The semiconductor device may include a source electrode formed over the source region. The source electrode may also be formed inside the contact trench. The semiconductor device may include a barrier metal between an inner wall of the contact trench and the source electrode.

In a second aspect of the present invention, a method of manufacturing a semiconductor device is provided. The manufacturing method may include forming, on an upper surface side of a semiconductor substrate, a first conductivity-type drift region, a second conductivity-type base region, a first conductivity-type source region, and two or more gate trenches penetrating through the source region and the base region. The manufacturing method may include forming a contact trench between two gate trenches, penetrating through the source region, and including its lower end arranged in the base region. The manufacturing method may include implanting impurities below the base region from the lower end of the contact trench to form a second conductivity-type protruding portion protruding toward a lower side from the lower end of the base region in a region opposite to the lower end of the contact trench.

An insulating film may be formed over the source region before the contact trench is formed. The contact trench penetrating through the insulating film may be formed.

The manufacturing method may include implanting impurities into the drift region from the lower end of the gate trench to form a first conductivity-type region adjacent to the lower end of the gate trench and the protruding portion, and having an impurity concentration higher than that of the drift region.

In the formation of the protruding portion, the impurities may be implanted respectively at different depths. The depth from the upper end of the source region to the lower end of the protruding portion may be 3 μm or more. A carrier concentration Nd of the drift region and a carrier concentration Na of the protruding portion may satisfy the following equation.

$$0.9 \leq \frac{Wc - Wt}{Wt} \times \frac{Nd}{Na} \leq 1.1 \qquad \text{[Equation 1]}$$

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through the embodiments of the invention. However, the embodiments described below are not to limit the claimed inventions. Also, all of all of combinations of features described in the embodiments are not necessarily essential for means for solving the problem of the invention.

(First Embodiment)

Figure 1:
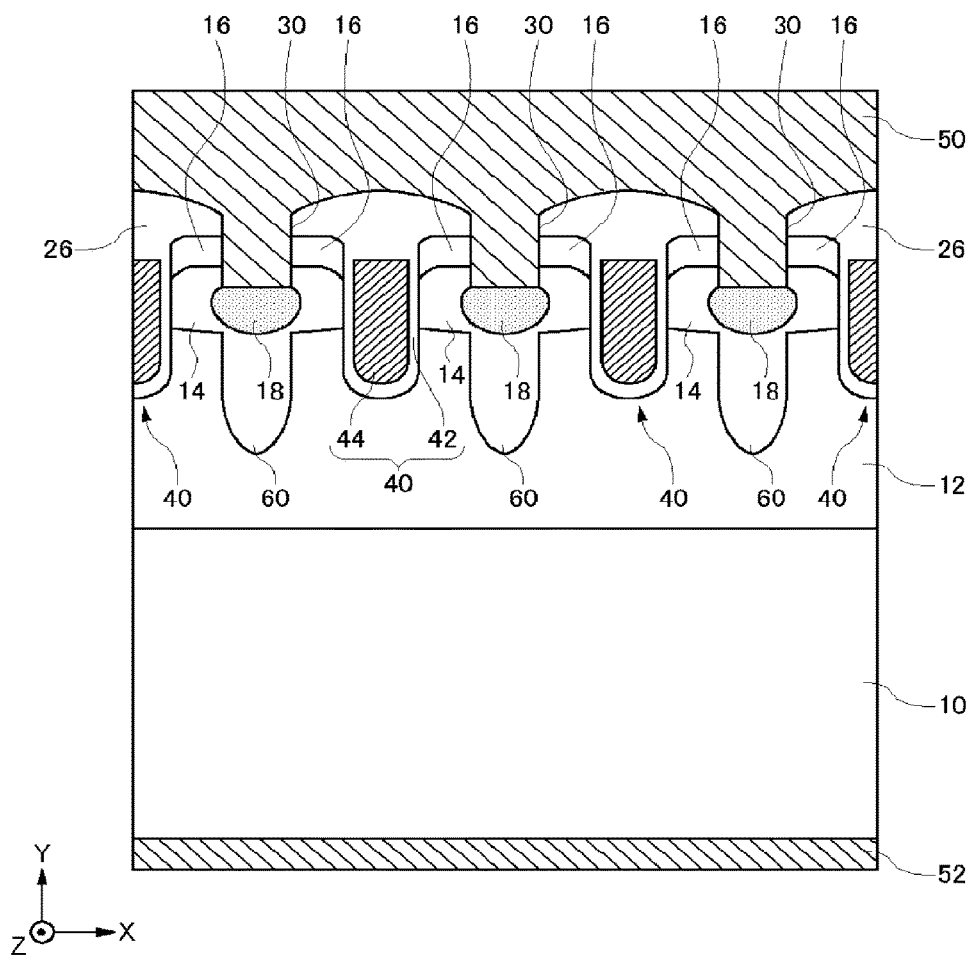
FIG. 1 is a cross-sectional view illustrating an outline of a semiconductor device 100 according to a first embodiment of the present invention.

FIG. 1 is a cross-sectional view illustrating an outline of a semiconductor device 100 according to a first embodiment of the present invention.

The semiconductor device 100 of the present example is an MOSFET, and includes a semiconductor substrate 10, a semiconductor region of a drift region 12 or the like formed on an upper surface side of the semiconductor substrate 10, a source electrode 50 formed on an upper surface side of the semiconductor region, and a drain electrode 52 formed on a lower surface side of the semiconductor substrate 10.

Note that in the present specification, one side in a direction parallel to a depth direction of the semiconductor substrate 10 is referred to as "upper" and the other side is referred to as "lower". The words "upper" and "lower" are not limited in the gravity direction. Also, although the terms "source" and "drain" are used, the semiconductor device 100 is not limited to MOSFET.

The terms "emitter" and "collector" in a bipolar transistor of IGBT or the like may also be included in the scope of the terms "source" and "drain" used herein. Also, although each embodiment shows an example in which the first conductivity-type and the second conductivity-type are taken as an n-type and a p-type, respectively, the conductivity-types of the substrate, layer, region, or the like may each be of reverse polarity.

The semiconductor substrate 10 is a substrate formed by a semiconductor of silicon, or a compound semiconductor including silicon carbide and gallium nitride. The semiconductor substrate 10 of the present example is an $n^+$-type, and functions as a drain region. A drain electrode 52 is formed on a lower surface of the semiconductor substrate 10. The drain electrode 52 is formed of metal materials of aluminum, gold, silver, or the like.

An $n^-$-type drift region 12, a p-type base region 14, and an $n^+$-type source region 16 are formed on the upper surface side of the semiconductor substrate 10. The upper surface side of the semiconductor substrate 10 may be over the upper surface of the semiconductor substrate 10 and may also be near the upper surface inside the semiconductor substrate 10.

The drift region 12 of the present example is a semiconductor layer epitaxially deposited on the upper surface of the semiconductor substrate 10. The base region 14 is formed over the drift region 12. The source region 16 is formed over the base region 14. The base region 14 may be formed by implanting impurities from the upper surface side of the drift region 12. The source region 16 may be formed by implanting impurities from the upper surface side of the base region 14.

In other examples, the base region 14 and the source region 16 may be formed by implanting impurities from the upper surface side of the $n^+$-type semiconductor substrate 10. In this case, the semiconductor substrate 10 functions as the drift region 12.

The drift region 12, the base region 14, and the source region 16 illustrated in FIG. 1 are formed in this order such that the base region 14 is formed on the base region, and the source region 16 is formed on the base region 14. In other examples, however, one or more regions may be formed respectively between the drift region 12 and the base region 14, and also between the base region 14 and the source region 16. As one example, in a case where the semiconductor device 100 is an IGBT, an n-type charge accumulation region having a concentration higher than that of the drift region 12 may be formed between the drift region 12 and the base region 14.

The semiconductor device 100 includes a plurality of gate trench sections 40. Each gate trench section 40 is formed by penetrating through the source region 16 and the base region 14 from the upper end side of the source region 16. A lower end of the gate trench section 40 of the present example is arranged within the drift region 12.

The gate trench section 40 has a gate trench penetrating through the source region 16 and the base region 14, a gate insulating film 42 covering an inner wall of the gate trench, and a gate conductive section 44 surrounded by the gate insulating film 42 inside the gate trench. The gate insulating film 42 forms an oxide film on the inner wall of the gate trench. The oxide film may be formed by, for example, thermal oxidization of the inner wall of the gate trench, and may also be formed by deposition by CVD technique. The gate conductive section 44 is formed by polysilicon into which impurities are doped, for example, and a gate voltage is applied thereto.

The gate conductive section 44 is formed in a region opposite to at least the base region 14 in the depth direction of the semiconductor substrate 10. A channel is formed in the base region 14 adjacent to the gate trench section 40 by applying a gate voltage to the gate conductive section 44.

The upper end of the gate trench section 40 is covered with an interlayer insulating film 26. The source electrode 50 is formed over the interlayer insulating film 26. The source electrode 50 is formed of metal materials of aluminum or the like, for example. The interlayer insulating film 26 is formed of NSG (Non dopped Silicate Glass), PSG (Phosphorus Silicate Glass), or BPSG (Boron Phosphorus Silicate Glass), for example. The gate conductive section 44 is insulated from the source electrode 50 by the interlayer insulating film 26.

The plurality of gate trench sections 40 are arranged along a predetermined arrangement direction. In FIG. 1, the arrangement direction of the gate trench section 40 and the depth direction of the semiconductor substrate 10 are taken as an X-axis direction and a Y-axis direction, respectively. Also, an axis perpendicular to both an X-axis and a Y-axis is taken as a Z-axis. In the present specification, there is a case where the X-axis direction is referred to as "a lateral direction." Each constitution illustrated in FIG. 1 may be formed being extended in the Z-axis direction. For example, the plurality of gate trench sections 40 is formed in a stripe shape in the Z-axis direction. The gate conductive section 44 may be electrically connected to the gate electrode in any position in the Z-axis direction.

The semiconductor device 100 includes a contact trench 30 formed between two gate trench sections 40. In the semiconductor device 100 of the present example, the contact trench 30 and the gate trench section 40 are alternately arranged in the X-axis direction.

Each of the contact trenches 30 penetrates through the interlayer insulating film 26 and the source region 16 from the upper end of the interlayer insulating film 26. The lower end of the contact trench 30 is arranged inside the base region 14. Thereby, the source region 16 and the base region 14 are exposed at the side wall of the contact trench 30.

The inside of the contact trench 30 is filled with the source electrode 50. The source electrode 50 in the present example is brought into contact with the source region 16 and the base region 14 exposed at the side wall of the contact trench 30. Thereby, a voltage is applied to the source region 16 and the base region 14.

A p-type high concentration region 18 having an impurity concentration higher than that of the base region 14 may be provided in a region adjacent to a bottom of the contact trench 30. Thereby, base resistance can be reduced. The high concentration region 18 is formed inside the base region 14. The high concentration region 18 is surrounded by the base region 14 and the contact trench 30.

A protruding portion 60 protruding toward a lower side is formed at the lower end of the base region 14. The protruding portion 60 is formed in a region opposite to the lower end of the contact trench 30. That is, at least a part of the region of the protruding portion 60 and at least a part of the region at the lower end of the contact trench 30 are formed in an overlapping position in the X-axis direction. In the present example, center of the protruding portion 60 in the X-axis direction and center of the contact trench 30 at the lower end in the X-axis direction are arranged in the same position on the X-axis.

The protruding portion 60 forms a superjunction with the n-type region adjacent to the protruding portion 60 in the lateral direction (X-axis direction). That is, the width and carrier concentration of the protruding portion 60 are adjusted so as to form the superjunction with the n-type region adjacent thereto.

As in the present example, it is possible to form the protruding portion 60 with less thermal history by arranging the protruding portion 60 in a position opposite to the lower end of the contact trench 30. As one example, the base region 14, the source region 16, and the interlayer insulating film 26 are formed, and the contact trench 30 is further formed. Then, the protruding portion 60 is formed by implanting impurities from the lower end of the contact trench 30 before the source electrode 50 is formed. Thereby, the protruding portion 60 can be easily formed down to a relatively deep position by ion implantation. Also, since the protruding portion 60 can be formed after the base region 14, the source region 16, and the interlayer insulating film 26 are formed, it is easier to reduce thermal history of the protruding portion 60.

Figure 2:
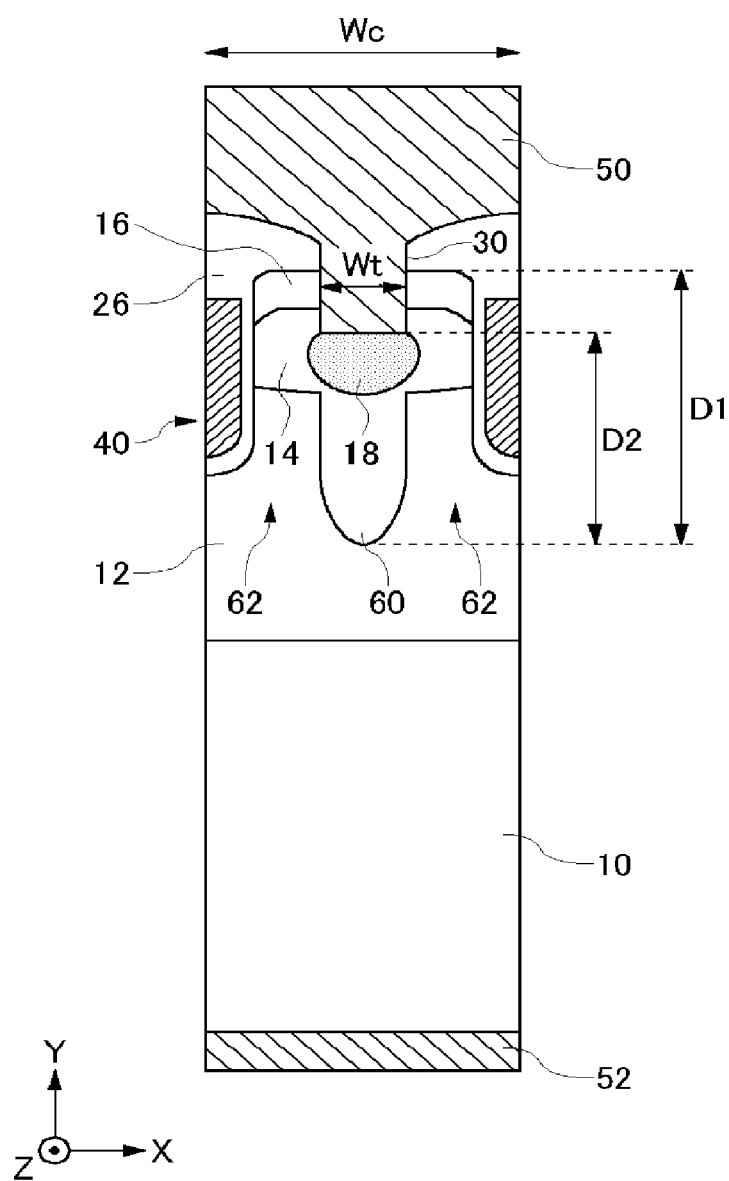
FIG. 2 is a view describing a width and a depth of a protruding portion 60.

FIG. 2 is a view describing the width and the carrier concentration of the protruding portion 60. In the example of FIG. 2, the width of the contact trench 30 in the X-axis direction is taken as Wt, and an interval between two gate trench sections 40 on both sides of the contact trench 30 is taken as Wc. The interval of the gate trench sections 40 refers to a distance between centers of the gate trench sections 40 in the X-axis direction. In the present specification, a range from the center of one gate trench section 40 to the center of another gate trench section 40 adjacent to the one gate trench section 40 in the X-axis direction is referred to as a cell. That is, an interval Wc corresponds to a width of one cell.

The carrier concentration of the protruding portion 60 is taken as Na. Also, the carrier concentration of an n-type adjacent region 62 adjacent to the protruding portion 60 in the lateral direction is taken as Nd. In the present example, the adjacent region 62 is a part of the drift region 12.

The semiconductor device 100 satisfies the following equation. Note that in the present example, the width of the protruding portion 60 is almost equal to a width Wt of the contact trench 30.

$$0.9 \leq \frac{Wc - Wt}{Wt} \times \frac{Nd}{Na} \leq 1.1 \qquad \text{[Equation 1]}$$

By satisfying the above-mentioned equation, a carrier quantity of the p-type protruding portion 60 in each cell and a carrier quantity of the adjacent region 62 are balanced so that a superjunction can be formed. Therefore, the side wall of the protruding portion 60 and the side wall of the gate trench section 40 will not be brought into contact with each other. By forming the superjunction, the impurity concentration of the adjacent region 62 can be increased. Thereby, drift resistance decreases, and it becomes difficult for a depletion layer to spread in the adjacent region 62 at the time of on-operation, and thus, on-resistance of the semiconductor device 100 can be reduced.

As one example, the interval Wc of the gate trench section 40 is 1.0 μm or more and 3.0 μm or less. Also, the width Wt of the contact trench 30 is 0.3 μm or more, and 2.0 μm or less. Also, it is preferable that a distance between the gate trench section 40 and the protruding portion 60 in the X-axis direction is 0.4 μm or more. If the distance between the gate trench section 40 and the protruding portion 60 is too close, the width of the n-type region adjacent to the protruding portion 60 becomes small, and thus it is difficult to form a superjunction.

Also, the depth from an upper end of the source region 16 to a lower end of the protruding portion 60 is taken as D1. It is preferable that a depth D1 is 3 μm or more, and 15 μm or less. If the depth D1 is 3 μm or smaller, an effect of reducing on-resistance by the superjunction becomes small. It is preferable that the lower end of the protruding portion 60 is formed on the lower side of the lower end of the gate trench section 40. A portion of the protruding portion 60 formed on the lower side of the lower end of the gate trench section 40 in the Y-axis direction may be longer than a portion of the protruding portion 60 formed on the upper side of the lower end of the gate trench section 40.

Also, if the depth D1 is 15 μm or larger, there is a case where it is difficult to form the protruding portion 60 by ion implantation from the lower end of the contact trench 30. In a case where a region for superjunction cannot be formed by ion implantation, superjunction p-column and n-column will be formed by a multistage epitaxial deposition or the like before the base region 14, the source region 16, or the interlayer insulating film 26 or the like is formed. In this case, the impurities are further diffused also in the superjunction by heat treatment at the time of forming the base region 14, the source region 16, or the interlayer insulating film 26 or the like, and thus, it is difficult to form the superjunction p-type region and n-type region with high precision.

Meanwhile, it is easy to form the protruding portion 60 by ion implantation by making the depth D1 15 μm or less. Accordingly, the protruding portion 60 can be formed after the base region 14, the source region 16, or the interlayer insulating film 26 or the like is formed, and thus thermal history of the protruding portion 60 can be reduced. The depth D1 may be 12 μm or less, may be 10 μm or less, and may be 6 μm or less.

Also, the depth from the lower end of the contact trench 30 to the lower end of the protruding portion 60 is taken as D2. It is preferable that a depth D2 is 14.7 μm or less. Thereby, it is easy to form the protruding portion 60 by ion implantation. The depth D2 may be 11 μm or less, may be 9 μm or less, or may be 5 μm or less.

Also, the lower end of the contact trench 30 may be arranged above the upper surface of the semiconductor substrate 10. That is, the drift region 12 may be provided between the lower end of the contact trench 30 and the upper surface of the semiconductor substrate 10.

Figure 3:
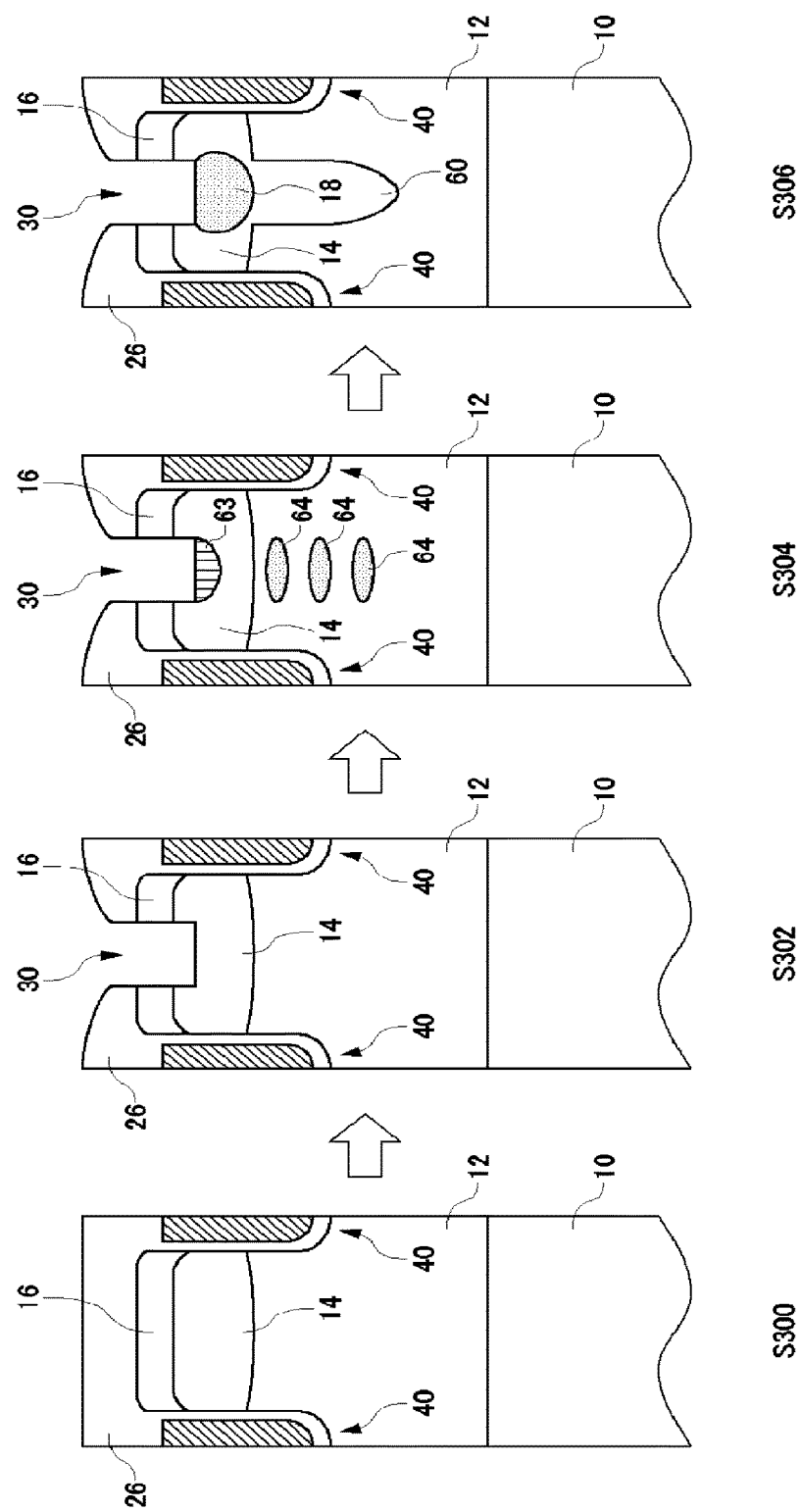
FIG. 3 is a view illustrating one example of a method of manufacturing the semiconductor device 100.

FIG. 3 is a view illustrating one example of a method of manufacturing the semiconductor device 100. Although FIG. 3 illustrates a cross-sectional view of one cell, other cells are also formed similarly. First, the semiconductor substrate 10 is prepared. In the present example, the semiconductor substrate 10 is an $n^+$-type silicon substrate having an impurity concentration of $1.0 \times 10^{20}/cm^3$.

Next, in step S300, an $n^-$-type epitaxial layer is formed on the upper surface of the semiconductor substrate 10. The impurity concentration of the epitaxial layer of the present example is $5.0 \times 10^{15}/cm^3$ or more, and $2.0 \times 10^{17}/cm^3$ or less. Also, the thickness of the epitaxial layer of the present example is 4 μm or more, and 20 μm or less. The thickness of the epitaxial layer varies depending on a breakdown voltage class of the semiconductor device 100. As one example, the epitaxial layer for a case where a breakdown voltage is 30 V is 3 μm or more, and 6 μm or less, the epitaxial layer for a case where a breakdown voltage is 60 V is 5 μm or more, and 8 μm or less, and the epitaxial layer for a case where a breakdown voltage is 150 V is 8 μm or more, and 11 μm or less.

Next, an oxide film is formed on an upper surface of the epitaxial layer. A resist mask is formed on an upper surface of the oxide film, and a gate trench mask having a predetermined pattern is formed by dry etching or the like. Next, the epitaxial layer not covered with the gate trench mask is subjected to dry etching by RIE technique, and a gate trench is formed. Next, etching damage in the inner wall of the gate trench is removed by chemical dry etching, sacrificial oxidation, or the like. Next, a gate insulating film is formed on the inner wall of the gate trench, and on the upper surface of the epitaxial layer around the gate trench. At this time, it is preferable that the insulating film of NSG or the like is deposited only on a bottom of the gate trench, and the insulating film on the bottom of the gate trench is made thicker than the insulating film on the inner wall.

Next, polysilicon into which n-type impurities are doped at high concentration is deposited within the gate trench, and a gate conductive section is formed. The polysilicon deposited on the upper surface of the epitaxial layer is removed by etching, and the polysilicon other than that within the gate trench is removed. Next, the oxide film on the upper surface of the epitaxial layer is removed. Thereby, the gate trench section 40 can be formed.

Next, on the upper surface of the epitaxial layer, an oxide film is formed in a region where the base region 14 and the source region 16 are not formed. Moreover, p-type impurities of boron or the like are ion-implanted from an upper surface side of the epitaxial layer. A dose amount of the p-type impurities in the present example is $1.0 \times 10^{13}/cm^2$ or more, and $1.0 \times 10^{14}/cm^2$ or less. The p-type impurities implanted are thermally diffused to the extent that the depth from the upper surface of the epitaxial layer is 1 to 2 μm, and the base region 14 is formed. The base region 14 is formed in contact with the gate trench section 40, and a region brought into contact with the gate trench section 40 functions as a channel.

Next, n-type impurities of arsenic or the like are ion-implanted from the upper surface side of the epitaxial layer. The dose amount of n-type impurities in the present example is around $5.0 \times 10^{15}/cm^2$. After ion implantation, heat treatment or the like is performed, and the source region 16 is formed. The source region 16 is also formed in contact with the gate trench section 40. Next, the interlayer insulating film 26 is formed on the upper surface of the epitaxial layer by CVD technique.

Next, in step S302, a resist pattern is formed on the upper surface of the interlayer insulating film 26. The interlayer insulating film 26 exposed by an opening portion of the resist pattern is etched by RIE, and the epitaxial layer is exposed. Next, the upper surface of the exposed epitaxial layer is etched, and the contact trench 30 that reaches the base region 14 is formed by penetrating through the interlayer insulating film 26 and the source region 16.

Next, in step S304, the p-type impurities of boron or the like are ion-implanted vertically in an implantation region 63 adjacent to the bottom of the contact trench 30. In the present example, an accelerating voltage of the p-type impurities is around 30 keV, and the dose amount thereof is $1.0 \times 10^{15}/cm^2$ or more, and $5.0 \times 10^{15}/cm^2$ or less.

Next, ion implantation is performed vertically from the lower end of the contact trench 30 in order to implant the p-type impurities of boron or the like below the base region 14. Here, the dose amount of the p-type impurities is set so as to satisfy Equation 1.

$$0.9 \leq \frac{Wc - Wt}{Wt} \times \frac{Nd}{Na} \leq 1.1 \qquad \text{[Equation 1]}$$

As one example, Wc is 2 μm, Wt is 1 μm, and Nd is $7.0 \times 10^{16}/cm^3$. In this case, the dose amount of the p-type impurities may be set such that Na is $7.0 \times 10^{16}/cm^3$.

Also, the implantation of the p-type impurities may be performed plural times by changing the accelerating voltage according to the depth of the protruding portion 60 to be formed. The depth of the protruding portion 60 is set according to the breakdown voltage to be included by the semiconductor device 100. For example, in the semiconductor device 100 of 30 V breakdown voltage, the p-type impurities of boron or the like are implanted once at a predetermined accelerating voltage in the range from 150 to 300 keV. In the semiconductor device 100 of 150 V breakdown voltage, the p-type impurities of boron or the like are implanted plural times by changing the accelerating voltage in the range from 150 KeV to 60 MeV.

One or more implantation regions 64 are formed below the base region 14 by the implantation of the p-type impurities. Note that it is preferable that the range at the time of implanting the p-type impurities is deeper than the base region 14. That is, it is preferable that an upper end of the implantation region 64 is deeper than the lower end of the base region 14. Thereby, it is possible to prevent spread of the protruding portion 60 in the width direction in a portion adjacent to the protruding portion 60 and the base region 14, and also possible to increase the impurity concentration of the adjacent region 62 adjacent to the protruding portion 60. For this reason, it is possible to prevent spread of a depletion layer from the protruding portion 60 at the time of on-operation and further reduce on-resistance.

Next, the semiconductor device 100 is thermally treated in step S306 in order to activate the p-type impurities implanted into the implantation region 63 and the implantation region 64. It is preferable that the heat treatment is performed in a short amount of time such that the p-type impurities are not diffused too much. As one example, the temperature of the heat treatment is around 950 degrees, and the time for the heat treatment is within 30 minutes.

Thereby, the high concentration region 18 and the protruding portion 60 are formed. After step S306, the source electrode 50, the drain electrode 52 and the like are formed, and then the semiconductor device 100 is complete. Note that it is preferable that a barrier metal layer including a titanium film, a titanium nitride film, a tantalum film, or a tantalum nitride film is formed on the inner wall of the contact trench 30 in order to prevent mutual diffuse between the source electrode 50 and the semiconductor region. Also, tungsten, molybdenum, polysilicon into which impurities are doped, or other substances may be filled inside the contact trench 30 before the source electrode 50 is formed in order to increase flatness of the source electrode 50.

(Second Embodiment)

Figure 4A:
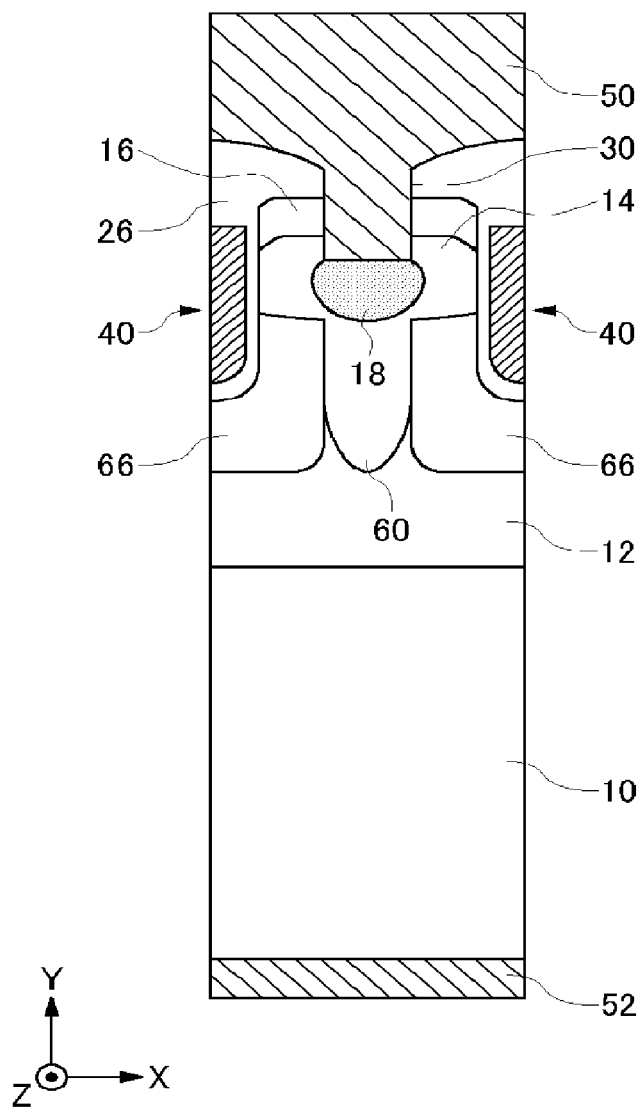
FIG. 4A is a cross-sectional view illustrating one example of a semiconductor device 200 according to a second embodiment of the present invention.
Figure 4B:
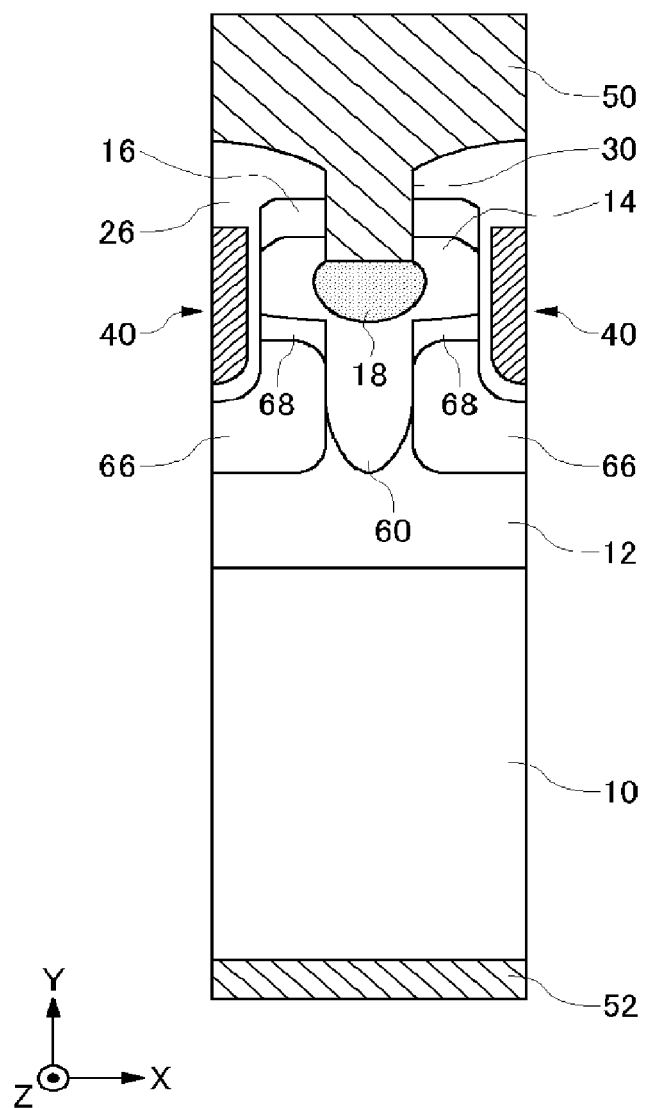
FIG. 4B is a cross-sectional view illustrating another example of the semiconductor device 200 according to the second embodiment of the present invention.

FIG. 4A is a cross-sectional view illustrating an outline of the semiconductor device 200 according to a second embodiment of the present invention. FIG. 4B is a cross-sectional view illustrating another example of the semiconductor device 200 according to the second embodiment of the present invention. The semiconductor device 200 illustrated in FIG. 4A includes a first conductivity-type region 66 in addition to the structure of the semiconductor device 100 according to the first embodiment. The first conductivity-type region 66 of the present example is an n-type. Other structures may be the same as those of any semiconductor device 100 described in FIG. 1 to FIG. 3.

The first conductivity-type region 66 formed adjacent to the lower end of at least one gate trench section 40 and the protruding portion 60. The semiconductor device 200 of the present example includes, for each gate trench section 40, a first conductivity-type region 66 surrounding the lower end of the gate trench section 40, and bringing into contact with the protruding portion 60 at its side end. The first conductivity-type region 66 has an impurity concentration higher than that of the drift region 12. It is preferable that the first conductivity-type region 66 has an impurity concentration ten times or more higher than that of the drift region 12.

The first conductivity-type region 66 constitutes a superjunction with the protruding portion 60. That is, at least a part of the region of the first conductivity-type region 66 and at least a part of the region of the protruding portion 60 are brought into contact with each other over a predetermined range of the depth direction. At least, in a range where the first conductivity-type region 66 and the protruding portion 60 are brought into contact with each other, it is preferable that the amount of the impurities in the first conductivity-type region 66 and the amount of the impurities in the protruding portion 60 are well-balanced.

That is, in a case where the impurity concentration in the first conductivity-type region 66 is taken as Ndx, it is preferable to satisfy Equation 2 given below.

$$0.9 \leq \frac{Wc - Wt}{Wt} \times \frac{Ndx}{Na} \leq 1.1 \qquad \text{[Equation 2]}$$

According to the semiconductor device 200, it is possible to make a carrier gradient between a superjunction p-n structure steep, and also possible to prevent the spread of the depletion layer at the time of on-operation, compared to the semiconductor device 100. For this reason, on-resistance can be further reduced.

The protruding portion 60 and the first conductivity-type region 66 may be formed in contact with each other over one-third or more of the length of the protruding portion 60 in the depth direction, and may also be formed in contact with each other over the half or more of the length of the protruding portion 60. Also, at least a part of the region where the protruding portion 60 and the first conductivity-type region 66 are adjacent to each other may be provided on the lower side of the lower end of the gate trench section 40.

The semiconductor device 200 may further include an n⁻-type intermediate region 68 provided between the first conductivity-type region 66 and the base region 14 in the depth direction as illustrated in FIG. 4B. The intermediate region 68 is formed adjacent to the gate trench section 40. The intermediate region 68 of the present example is provided between the gate trench section 40 and the protruding portion 60 in the lateral direction.

The intermediate region 68 has an impurity concentration lower than that of the first conductivity-type region 66. The impurity concentration of the intermediate region 68 may be the same as that of the drift region 12. By providing the intermediate region 68, it is possible to prevent generation of avalanche and a parasitic bipolar operation near the channel region, and prevent reduction in L load capacity. The length of the intermediate region 68 in its depth direction may be shorter than the length of the first conductivity-type region 66 in its depth direction.

Note that it is preferable that the lower end of the protruding portion 60 and the lower end of the first conductivity-type region 66 are arranged in the position of the same depth. Thereby, a superjunction region by the protruding portion 60 and the first conductivity-type region 66 can be formed with precision.

Figure 5:
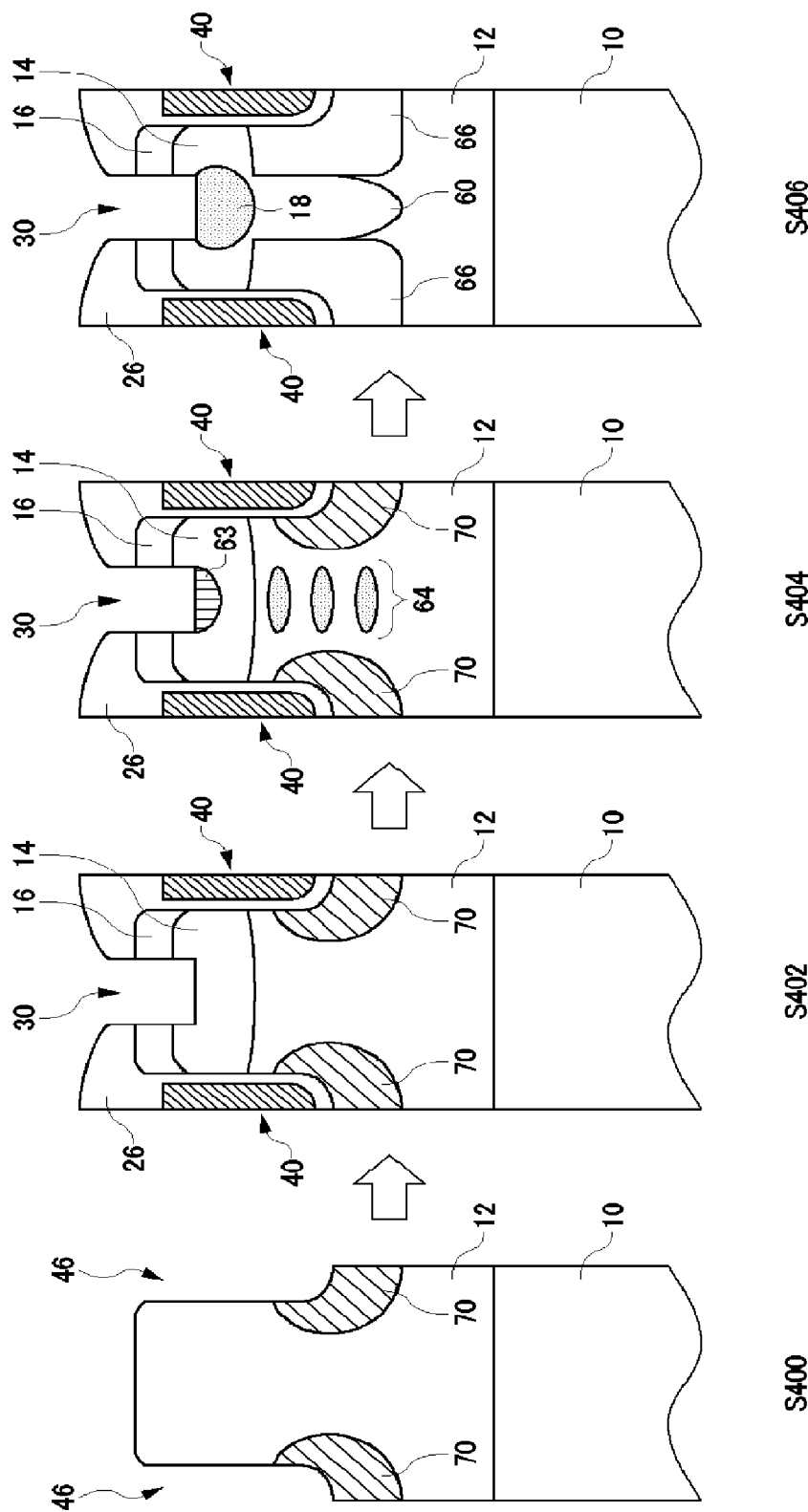
FIG. 5 is a view illustrating one example of a method of manufacturing the semiconductor device 200.

FIG. 5 is a view illustrating one example of a method of manufacturing the semiconductor device 200 illustrated in FIG. 4A. Although FIG. 5 illustrates a cross-sectional view of one cell, other cells are also formed similarly. Also, the manufacturing method of the present example is similar to the manufacturing method illustrated in FIG. 3 except for the formation of the first conductivity-type region 66. Unless otherwise described particularly, each step can be implemented in a similar manner to the manufacturing method illustrated in FIG. 3.

In the manufacturing method of the present example, as illustrated in step S400, the n-type impurities are implanted vertically relative to an implantation region 70 of the drift region 12 from the lower end of the gate trench 46 after the gate trench 46 is formed in the semiconductor substrate 10 and before the gate insulating film 42 and the gate conductive section 44 are formed. The implantation region 70 of the present example is a region surrounding the lower end of the gate trench 46. Also, the n-type impurities are phosphorous, for example.

The implantation of the n-type impurities of phosphorous or the like may be performed plural times by changing the accelerating voltage according to the depth of the first conductivity-type region 66 to be formed. The depth of the first conductivity-type region 66 may be set according to the breakdown voltage to be included in the semiconductor device 200. For example, in the semiconductor device 200 of 30 V breakdown voltage, the n-type impurities of phosphorous or the like are implanted once at a predetermined accelerating voltage in the range of 30 to 150 keV. In the semiconductor device 200 of 150 V breakdown voltage, the n-type impurities are implanted plural times by changing the accelerating voltage in the range of 30 keV to 14.0 MeV.

As will be described later, the first conductivity-type region 66 can be formed by activating the impurities. It is possible to form the first conductivity-type region 66 easily in a relatively deep position of the drift region 12 by implanting the impurities after the gate trench 46 is formed, and before the gate insulating film 42 is formed.

Note that the impurities may be implanted into the implantation region 70 such that the drift region 12 remains between the first conductivity-type region 66 and the base region 14. Thereby, it is possible to form the intermediate region 68 easily between the first conductivity-type region 66 and the base region 14 illustrated in FIG. 4B.

Next, in step S402, the gate trench section 40, the base region 14, the source region 16, the interlayer insulating film 26, and the contact trench 30 are formed. Similar to step S302 of FIG. 3, the contact trench 30 is formed such that it penetrates through the interlayer insulating film 26 and the source region 16 after the base region 14, the source region 16, and the interlayer insulating film 26 are formed.

Next, in step S404, the p-type impurities are implanted into the implantation region 63 and the implantation region 64. Step S404 is similar to step S304 of FIG. 3. Next, in step S406, heat treatment is performed, the impurities of the implantation region 63 and the implantation region 64 are activated, and then the high concentration region 18 and the protruding portion 60 are formed. In step S406, the impurities of the implantation region 70 may also be activated. Also, the impurities of the implantation region 70 may be activated in the activation of the impurities of the base region 14 or the source region 16. Thereby, the first conductivity-type region 66 is formed. The semiconductor device 200 can be manufactured in this way.

Figure 6:
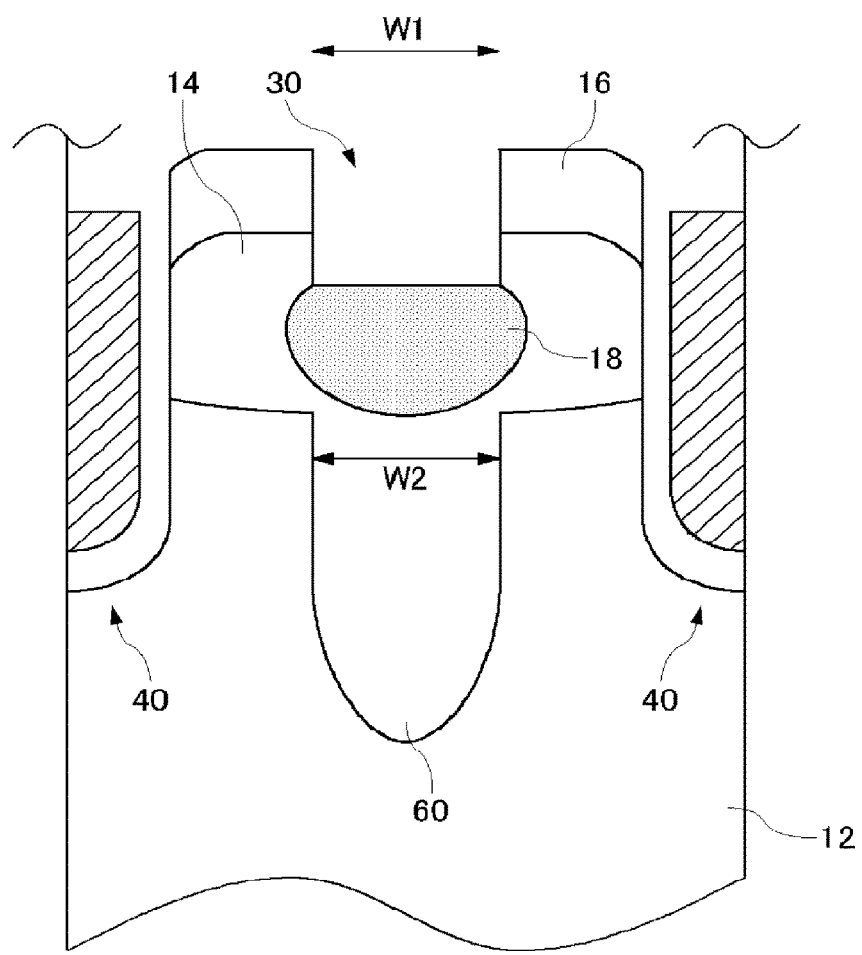
FIG. 6 is a view illustrating the relationship between a width W1 of a contact trench 30 and a width W2 of a protruding portion 60.

FIG. 6 is a view illustrating the relationship between a width W1 of the contact trench 30 and a width W2 of the protruding portion 60. In the present example, the width W2 of the protruding portion 60 is a width of the protruding portion 60 in the region contacting the lower end of the base region 14. Also, in the present example, the width W1 of the contact trench 30 is the maximum width out of the width of the contact trench 30. Note that the protruding portion 60 may slightly increase its width with distance from the lower end of the base region 14.

It is preferable that the width W2 of the protruding portion 60 is almost the same as the width W1 of the contact trench 30. More specifically, it is preferable that the width W2 of the protruding portion 60 is 0.9 times or more, and 1.1 times or less of the width W1 of the contact trench 30. The width W2 of the protruding portion 60 may be 1.0 times or more of the width W1 of the contact trench 30.

The width of the implantation region 64 illustrated in FIG. 5 is determined by the width of the contact trench 30. For this reason, it is preferable to control conditions on the heat treatment after the implantation region 64 is formed so as not to spread the width W2 of the protruding portion 60 too much. Thereby, the width W2 of the protruding portion 60 can be defined by the width W1 of the contact trench 30, and thus, it is possible to form a superjunction region with precision.

Figure 7:
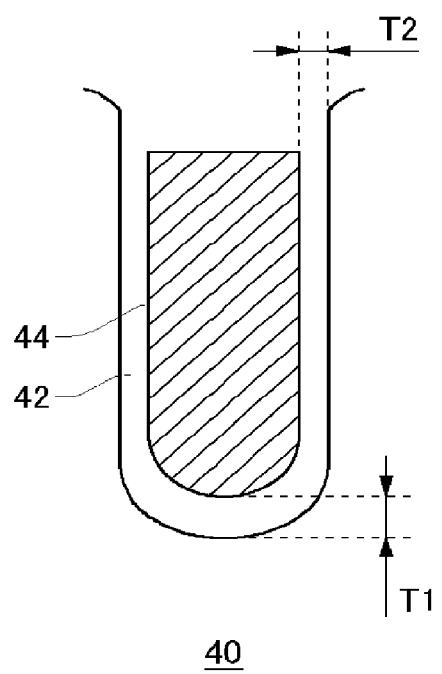
FIG. 7 is a view illustrating one example of a structure of a gate insulating film 42.

FIG. 7 is a view illustrating one example of the structure of the gate insulating film 42. In the gate insulating film 42 of the present example, a thickness T1 of a portion formed at the lower end of the gate trench is thicker than a thickness T2 of a portion formed at the side wall of the gate trench. Thereby, it is possible to increase a breakdown voltage at the bottom of the gate trench which is relatively easier for electric field to concentrate.

The thickness T1 of the gate insulating film 42 at the lower end of the gate trench may be two times or more of the thickness T2. The gate insulating film 42 at the lower end of the gate trench may be an insulating film in which the oxide film in which the inner wall of the gate trench is oxidized and a deposition film by CVD technique or the like are stacked.

Figure 8:
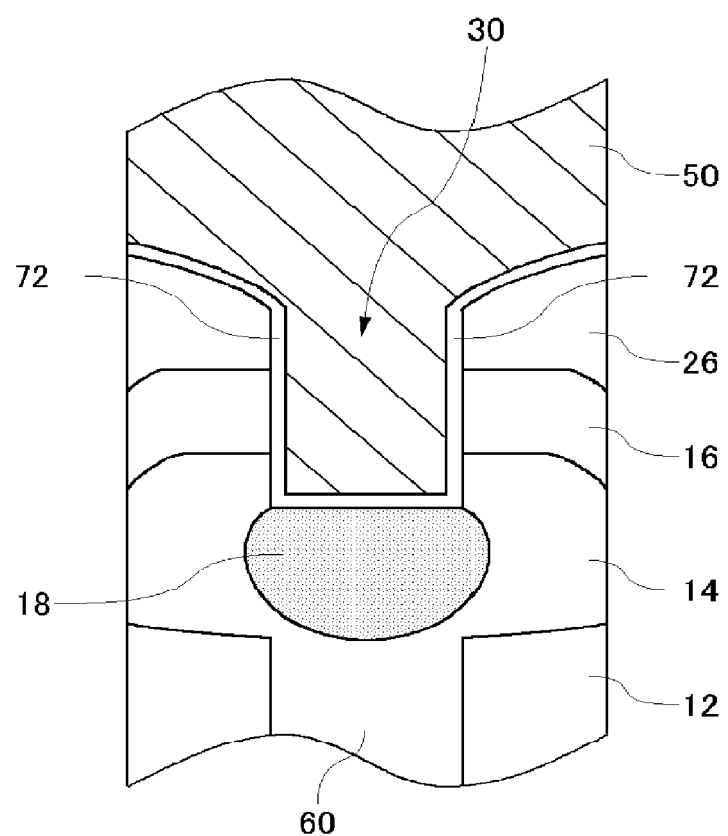
FIG. 8 is a view illustrating one example of a barrier metal 72 formed on an inner wall of the contact trench 30.

FIG. 8 is a view illustrating one example of the barrier metal 72 formed on the inner wall of the contact trench 30. The barrier metal 72 is formed between the inner wall of the contact trench 30 and the source electrode 50. The barrier metal 72 prevents aluminum or the like included in the source electrode 50 from being diffused into the semiconductor region of the source region 16 or the like, and also prevents the semiconductor materials of the source region 16 or the like from being alloyed with the source electrode 50.

The barrier metal 72 is formed by a material which is not likely to be diffused in the semiconductor material than the material of the source electrode 50. The barrier metal 72 may include a titanium film, a titanium nitride film, a tantalum film, or a tantalum nitride film, or may be a laminated film thereof.

The barrier metal 72 is formed so as to cover the semiconductor region exposed on the inner wall of the contact trench 30. The barrier metal 72 is not required to cover the entire interlayer insulating film 26, and at least a part of the interlayer insulating film 26 exposed on the inner wall of the contact trench 30 has only to be covered.

Figure 9:
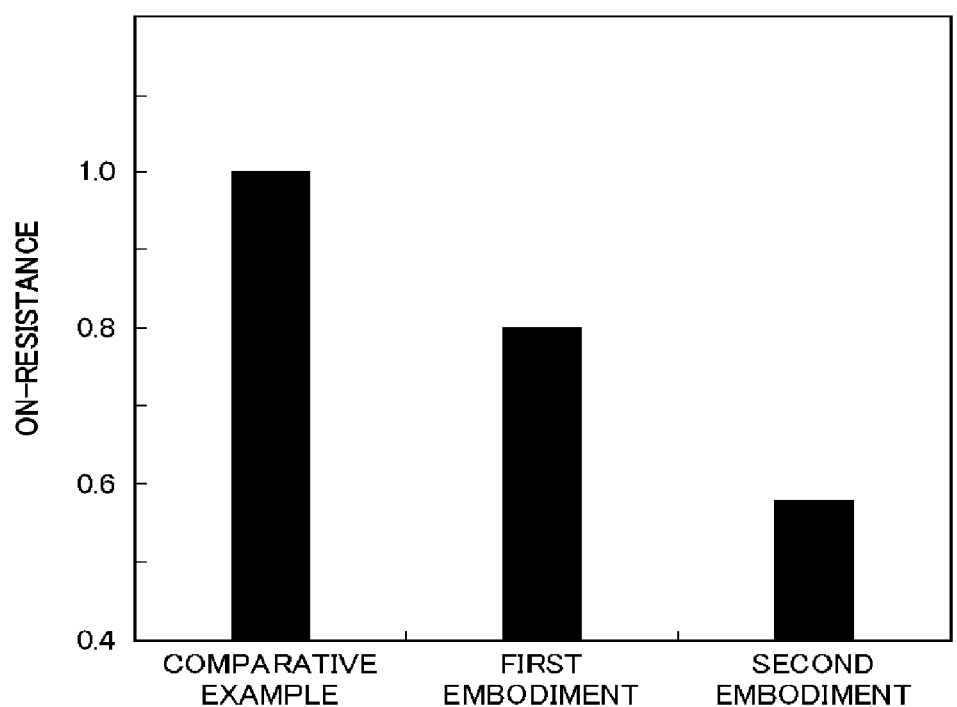
FIG. 9 is a view illustrating one example of on-resistance of the semiconductor device 100 of the first embodiment and the semiconductor device 200 of the second embodiment.

FIG. 9 is a view illustrating one example of on-resistance of the semiconductor device 100 of the first embodiment and the semiconductor device 200 of the second embodiment. FIG. 9 also illustrates, as a comparative example, on-resistance of MOSFET where the protruding portion is not formed. A longitudinal axis of FIG. 9 illustrates a normalized value with on-resistance of the comparative example.

As illustrated in FIG. 9, on-resistance of the semiconductor device in the first embodiment and the second embodiment is lower than on-resistance of the comparative example where the protruding portion is not formed. Also, on-resistance in the second embodiment where the first conductivity-type region 66 is provided is further lower than on-resistance in the first embodiment.

Figure 10:
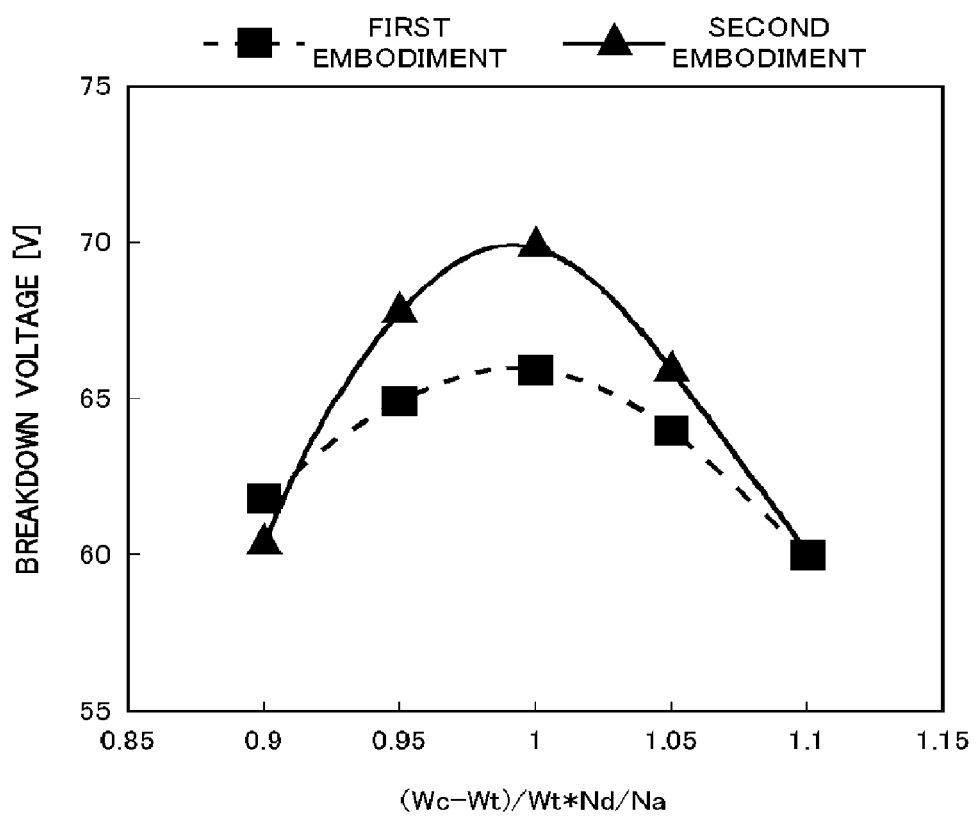
FIG. 10 is a view illustrating one example of a breakdown voltage of the semiconductor device in the first embodiment and the second embodiment.

FIG. 10 is a view illustrating one example of a breakdown voltage of the semiconductor device in the first embodiment and the second embodiment. In FIG. 10, (Wc−Wt)/Wt×Nd/Na illustrated in Equation 1 is taken as a horizontal axis. It is possible to confirm that a predetermined breakdown voltage (approximately 60 V in the present example) can be maintained as long as (Wc−Wt)/Wt×Nd/Na is in the range of Equation 1. That is, according to the first embodiment and the second embodiment, on-resistance can be reduced while maintaining the breakdown voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10: semiconductor substrate, 12: drift region, 14: base region, 16: source region, 18: high concentration region, 26: interlayer insulating film, 30: contact trench, 40: gate trench section, 42: gate insulating film, 44: gate conductive section, 46: gate trench, 50: source electrode, 52: drain electrode, 60: protruding portion, 62: adjacent region, 63, 64, 70: implantation region, 66: first conductivity-type region, 68: intermediate region, 72: barrier metal, 100: semiconductor device, 200: semiconductor device

What is claimed is:

1. A method of manufacturing a semiconductor device, comprising:
    forming, at an upper surface side of a semiconductor substrate, a first conductivity-type drift region, a second conductivity-type base region, a first conductivity-type source region, and two or more gate trenches penetrating through the source region and the base region;
    forming a contact trench between two gate trenches, penetrating through the source region, and including a lower end of the contact trench arranged in the base region; and
    implanting impurities below the base region from the lower end of the contact trench to form a second conductivity-type protruding portion protruding toward a lower side from a lower end of the base region in a region opposite to the lower end of the contact trench, wherein
    a carrier concentration Nd of a first conductivity-type region adjacent to the protruding portion in a lateral direction perpendicular to a depth direction and a carrier concentration Na of the protruding portion satisfy a following equation $$0.9 \leq \frac{Wc - Wt}{Wt} \times \frac{Nd}{Na} \leq 1.1 \qquad \text{[Equation 1]}$$

wherein Wc is an interval between the two gate trenches, and Wt is a width of the contact trench.

2. The method according to claim 1, wherein
    an insulating film is formed over the source region before the contact trench is formed, and
    the contact trench penetrating through the insulating film is formed.

3. The method according to claim 1, wherein the impurities are respectively implanted at different depths in the formation of the protruding portion.

4. The method according to claim 1, wherein
    a depth from an upper end of the source region to a lower end of the protruding portion is 3 μm more.

5. The method according to claim 1, further comprising implanting impurities from the lower end of the gate trench into the drift region to form a first conductivity-type region adjacent to a lower end of the gate trench and the protruding portion, having an impurity concentration higher than that of the drift region.

* * * * *